United States Patent [19]

Nakatsukasa et al.

[11] Patent Number: 5,185,234
[45] Date of Patent: Feb. 9, 1993

[54] PHOTOSENSITIVE FLEXOGRAPHIC PRINTING PLATE COMPOSITION

[75] Inventors: Sadayoshi Nakatsukasa; Toshihiro Fujii; Ban Tanaka; Kosaku Yamada, all of Fukuyama City, Japan

[73] Assignees: Hayakawa Rubber Co., Ltd.; Nippon Paint Co., Ltd., both of Japan

[21] Appl. No.: 736,562

[22] Filed: Jul. 26, 1991

[30] Foreign Application Priority Data

Aug. 8, 1990 [JP] Japan .................. 2-208131

[51] Int. Cl.$^5$ ................... G03F 7/033; G03F 7/035
[52] U.S. Cl. .................... 430/284; 430/905; 430/286; 430/287; 522/95; 522/96
[58] Field of Search ............. 430/284, 907; 522/95, 522/96

[56] References Cited

U.S. PATENT DOCUMENTS

4,269,680  5/1981  Rowe ................ 204/159

FOREIGN PATENT DOCUMENTS

| 0331841 | 9/1989 | European Pat. Off. ....... 430/284 |
| 2389924 | 1/1978 | France . |
| 54-66830 | 5/1979 | Japan ................ 430/284 |
| 1598894 | 9/1981 | United Kingdom . |

*Primary Examiner*—Cynthia Hamilton
*Attorney, Agent, or Firm*—Parkhurst, Wendel & Rossi

[57] ABSTRACT

The disclosed photosensitive flexographic printing plate composition is to impart a soft printing plate by rubber compounding photosensitive resin which comprises (A) 5–50 wt % of a photopolymerizable prepolymer consisting essentially of a component having the general formula

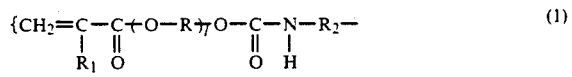
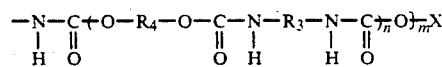

(1)

where, R is an alkylene group or polyoxyalkylene group having 2–8 carbons, $R_1$ is an H or $CH_3$ group, $R_2$ and $R_3$ are diisocyanate residues, $R_4$ is a portion excluding a hydroxyl group of dienic liquid rubber having a hydroxyl group of dihydric alcohol having less than 2000 molecular weight of the general formula

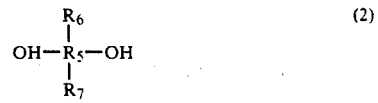

(2)

where, $R_5$ is an alkylene group having 2–8 carbons, $R_6$ and $R_7$ are an H, $CH_3$ or acryloyloxy, methacryloyloxy, allyloxy group, X is a residue excluding hydroxyl group(s) of a dienic liquid rubber having hydroxyl group(s), l is an integer of 1–4, m is $1 < m < 4$, and n is an integer of 1–16, (B) 35–65 wt % of styrene butadiene rubber containing 20–30 wt % of styrene, (C) 25–55 wt % of a styrene butadiene block copolymer or styrene isoprene block copolymer containing 11–37 wt % of styrene, (D) 0–15 wt % of a liquid prepolymer selected from polybutadiene having 1000–5500 molecular weight, a butadiene-styrene copolymer and their derivative, (E) 3–50 wt % of a photopolymerizable monomer having one or more than one photopolymerizable ethylene bonds, and (F) 0.5–30 wt % of a photopolymerization initiator. The printing with high precision can easily be carried out with the use of the composition and a deep and sharp relief pattern can be formed by existing a special photosensitive oligomer and polymer component having a rubbery skeleton.

4 Claims, No Drawings

PHOTOSENSITIVE FLEXOGRAPHIC PRINTING PLATE COMPOSITION

BACKGROUND OF THE INVENTION

1. Field of the Invention

The present invention relates to a photo-sensitive flexographic printing plate composition imparting a soft printing plate by rubber compounding photosensitive resin.

2. Related Art Statement

Hitherto, as a flexographic printing plate, use is mainly made of a rubber plate, and such rubber plate is manufactured through a complicated process such as a process for forming a metallic original plate by etching a metal plate, a process for forming a matrix by heat pressing the metallic original plate to thermosetting resin, a process for forming a vulcanized rubber sheet by hot pressing a rubber sheet to the matrix and the like. However, such a process has many disadvantages such as poor reproducibility of a fine image portion owing to repetitive image decal, waste of cost and time owing to requirement of many processes, necessity of skilled workers, defaced dots at the time of printing and the like.

Moreover, fine image printing is difficult, and a viscosity of the obtained rubber plate itself is low, so that there are such disadvantages that back shaving is required in use, manufacturable printing plate size is limited in apparatus and process, and any big size cannot be obtained.

In order to solve the above disadvantages, it is common practice today to directly manufacture a printing plate with the use of a photosensitive resin composition.

As such a printing plate composition, use is made of urethane modified acrylate obtained by introducing polyether or polyester into a compound having a polymerizable double bond, a Styrene-butadiene block copolymer, a Styrene-isoprene block copolymer, 1,2-polybutadiene and the like, and they satisfy the usually required hardness (Shore hardness A 40-80), but are insufficient in toughness, so that a printing plate and its relief are broken, a relief depth is shallow, and a moldable hardness range is narrow.

In order to improve performances of these relief plates, there have recently been developed widely usable rubbers such as chloroprene rubber, acrylonitrile-butadiene rubber, Styrene-butadiene rubber and the like, a photosensitive resin composition consisting essentially of a photopolymerizable monomer and a photopolymerization initiator.

However, a printing plate with the use of prior photosensitive resin generally becomes a highly hard rubber plate, lacks rubber elasticity, and is poor in transition against durability, solvent resistance, wear resistance and aqueous ink as compared with a vulcanized rubber printing plate. Moreover, even in case of using a low hardness rubber plate, there is no rubber elasticity and restorability for printing is lowered.

Moreover, in case of a resolution film-casting drying method with the use of a solvent, a process for removing the solvent is required, the process becomes complicated, a thick article is difficult to be manufactured, a plate is liable to be strained, and change in quality easily occurs at the time of drying.

Particularly in flexographic printing on a printing body of coarse material and a printing body having uneven thickness, plate making is complicated, and at present a photosensitive printing plate composition having satisfiable performance cannot yet be obtained.

SUMMARY OF THE INVENTION

An object of the present invention, therefore, is to provide a novel photosensitive flexographic printing plate composition having excellent performances such as image forming ability, printing suitability, rubber elasticity, wear-resistant properties and the like by eliminating all of the above disadvantages.

The present inventors have earnestly studied to solve the above problems, and as a result, found that one could obtain a photosensitive printing plate composition having excellent characteristics by compounding a special photopolymerizable oligomer or polymer with rubber as a skeleton, random copolymerizable Styrene-butadiene rubber, a Stylene rubber block copolymer, a photopolymerizable monomer, and a photopolymerization initiator at a specific ratio. This is the present invention.

That is, the present invention relates to a photosensitive flexographic printing plate composition comprising (A) 5-50 wt % of a photopolymerizable prepolymer consisting essentially of a component having the general formula

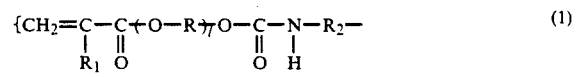

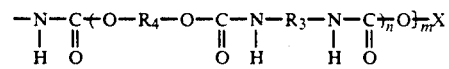

wherein R is an alkylene group or polyoxyalkylene group having 2-8 carbons, $R_1$ is an H or $CH_3$ group, $R_2$ and $R_3$ are diisocyanate residues, $R_4$ is a residue excluding a hydroxyl group of dihydric alcohol having less than 2000 molecular weight of the general formula

wherein, $R_5$ is an alkylene group having 2-8 carbons, $R_6$ and $R_7$ are an H, $CH_3$ or acryloyloxy, methacryloyloxy, alyloxy group, X is a residue excluding hydroxyl group(s) of a dienic liquid rubber having hydroxyl group(s), l is an integer of 1-4, m is $1 < m < 4$, and n is an integer of 1-16, (B) 35-65 wt % of Styrene-butadiene rubber containing 20-30 wt % of styrene, (C) 25-55 wt % of a Styrene-butadiene block copolymer or Styrene-isoprene block copolymer containing 11-37 wt % of styrene, (D) 0-15 wt % of a liquid prepolymer selected from polybutadiene having 1000-5500 molecular weight, a butadiene-styrene copolymer and their derivative, (E) 3-50 wt % of a photopolymerizable monomer having one or more photopolymerizable ethylenically unsaturated groups, and (F) 0.5-30 wt % of a photopolymerization initiator.

The present invention will be explained on the basis of the construction thereof as follows.

The photopolymerizable prepolymer (A) component used in the present invention has the following formula:

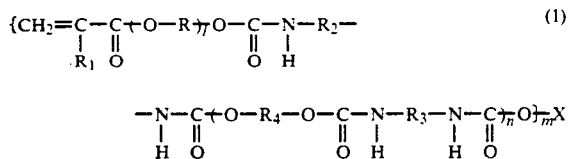 (1)

wherein, R is an alkylene group or polyoxyalkylene group having 2-8 carbons, $R_1$ is an H or $CH_3$ group, $R_2$ and $R_3$ are diisocyanate residues, $R_4$ is a residual group excluding a hydroxyl group of dihydric alcohol having less than 2000 molecular weight and the general formula:

 (2)

wherein, $R_5$ is an alkylene group having 2-8 carbons, $R_6$ and $R_7$ are an H, $CH_3$ or allyloxy group, X is a portion excluding hydroxyl group(s) of dienic liquid rubber having hydroxyl group(s), l is an integer of 1-4, m is $1 < m < 4$, and n is an integer of 1-16.

Said photopolymerizable prepolymer consists essentially of a reacted component of dienic liquid rubber, an ethylenically unsaturated monomer, dihydric alcohol and a diisocyanate compound, which component is compounded with an addition polymerizable monomer and a thermopolymerization inhibitor.

As dienic liquid rubber, mention may be made of 1,2-polybutadiene, 1,4-polybutadiene, 1,2-pentadiene, styrene-butadiene copolymer, acrylonitrile-butadiene copolymer having a hydroxyl group in molecule and the like, which can be used alone or in combination. A number-average molecular weight of said dienic liquid rubber polymer having a hydroxyl group where m is $1 < m < 4$ is 1000-10000. Moreover, the hydroxyl group number (m) in molecule is $1 < m < 4$, since $m \leq 1$ lowers photo crosslinking density and cannot satisfy solid maintenance of a photo setting material, and $m \geq 4$ is too hard, lowers elasticity and cannot obtain desired rubber elasticity.

As the above ethylenically unsaturated monomer having a monovalent hydroxyl group, mention may be made of 2-hydroxyethyl acrylate, 2-hydroxyethyl methacrylate, 2-hydroxypropylacrylate, 2-hydroxylpropyl methacrylate, polypropyleneglycol mono(meth)acrylate, glycidoldi(meth)acrylate, pentaerythritol triacrylate and the like, and one or more than two of them are compounded in amount of 2-25 parts by weight with 100 parts by weight of liquid rubber.

As the above diisocyanate compound, mention may be made of tolylene diisocyanate, 4,4'-diphenylmethane diisocyanate, xylylenediisocyanate, hexamethylene diisocyanate, isophorone diisocyanate, methylenebis(4-cyclohexylisocyanate), trimethylhexamethylene diisocyanate and the like, and one or more than two of them are compounded in amount of 5-190 parts by weight with 100 parts by weight of liquid rubber.

Moreover, the above dihydric alcohol having less than 2000 molecular weight has the following formula:

 (2)

where $R_5$ is an alkylene group having 2-6 carbons, $R_6$ and $R_7$ are an H, $CH_3$, (meth)acryloxy or allyloxy group, and it is possible to use dihydric alcohol with R of the above formula (1) as a skeleton and dihydric alcohol having a photopolymerizable ethylenically unsaturated group. As the above dihydric alcohol with R of the above formula (1) as a skeleton, mention may be made of ethylene glycol, diethylene glycol, triethylene glycol, 1,2-propylene glycol, 1,3-propylene glycol, 1,3-butanediol, 1,4-butanediol, 1,5-pentanediol, 1,6-hexanediol and the like, and as the dihydric alcohol having a photopolymerizable ethylenically unsaturated group, mention may be made of trimethylolpropane monoacrylate, trimethylolpropane monomethacrylate, glycerol α-monoallylether and the like, and one or more than two of them are compounded in amount of 2-90 parts by weight with 100 parts by weight of liquid rubber.

A compounding ratio of the above components is $m \times n$ mol of dihydric alcohol having less than 2000, preferably less than 300, of molecular weight, $mx(n+1)$ mol of a diisocyanate compound, and m mol of ethylenic unsaturated monomer having a monovalent hydroxyl group to 1 mol of dienic liquid rubber where the valence number of a hydroxyl group is $m(1 < m < 4)$ within one molecule at a repetitive unit n of an urethane bond.

Here, n is a repetitive unit number of the urethane bond consisting of a diisocyanate compound and dihydric alcohol having less than 2000 molecular weight and shows an integer of 1-16, and when the repetitive unit number becomes $n > 16$ or $n < 1$, rubber-like properties are unfavorably lost. The portion n means a length of the portion forming a hard segment with respect to a rubber molecular chain (soft segment). A long hard segment is formed by continuation of urethane bonds having high polarity and cohesiveness, and causes microscopic phase separation from a rubber molecular chain (soft segment) having low polarity and cohesiveness. Moreover, a close crosslinking is imparted between photopolymerizable ethylenically unsaturated groups following to the hard segment. Therefore, a photopolymerizable prepolymer or oligomer used in the present invention becomes a photo-setting material having high strength and high extension by radiation of active energy rays. When using dihydric alcohol including $R_4$ of more than 2000 molecular weight, it becomes difficult to cause phase separation between the hard segment and the soft segment, a desired object cannot be attained, and hence, molecular weight of dihydric alcohol including $R_4$ is less than 2000, preferably less than 300. Such dihydric alcohol having less than 2000 molecular weight is introduced into a skeleton of the hard segment.

Said prepolymer component is composed of a hard segment of the above formula (2) and a soft segment consisting of an X portion of the above formula (1), i.e., a skeleton of dienic liquid rubber.

As an addition polymerizable monomer, mention may be made of the above ethylenically unsaturated monomer having monovalent hydroxyl group, methacrylates such as methylmethacrylate, ethylmethacrylate, butylmethacrylate, glycidylmethacrylate, 1,4-butylene dimethacrylate, ethyleneglycol dimethacrylate, diethylaminoethyl methacrylate and the like, acrylates such as methylacrylate, ethylacrylate, butylacrylate, laurylacrylate, trimethylolpropane diacrylate, trimethylolpropane triacrylate, neopentylglycol diacrylate, 1,6-hexanedioldiacrylate, diethylaminoethylacrylate and the like, and methacrylic acid, acrylic acid, acrylonitrile, acrylamide, N-methylolacrylamide, styrene, vinyltoluene, divinylbenzene, α-methylstyrene, vinyl acetate, N-vinyl-2-pyrrolidone, diallylphthalate and the like.

DESCRIPTION OF THE PREFERRED EMBODIMENT

Synthesis of said photopolymerizable prepolymer is explained in detail. In a suitably selected solvent, to $(m \times n)$ mol of dihydric alcohol having less than 2000 molecular weight is added diisocyanate little by little at a ratio of $mx(n+1)$ mol in the presence of a catalyst such as dibutyltindilaurate, tin octenate, triethylamine, triethylenediamine and the like, to form a compound having isocyanate groups at both ends. A reaction temperature in this case is 10°–120° C., preferably 40°–80° C. Then, with said compound is reacted, for example, m mol of an ethylenically unsaturated monomer having a monovalent hydroxyl group by gradually adding, to form a compound having an isocyanate group at one end, thereafter to the compound is gradually added 1 mol of dienic liquid rubber having a bivalent hydroxyl group. In this synthetic reaction, for controlling thermal polymerization, it is preferable to add 0.05–1 wt % of the total compounding weight of one or more thermal polymerization inhibitors such as hydroquinone, t-butylcatechol, o-dinitrophenol, m-nitrophenol, p-nitrophenol, 2,4-dinitrophenol, 2,4,6-trinitrophenol, methoquinone, p-benzoquinone, phenothiazine, anthraquinone, 2,6-di-t-butylhydroxytoluene and the like, if necessary. Whereby, there is synthesized a photopolymerizable prepolymer having the above formula (1), displaying a rubber skeleton structure and having an acryloyloxy group, methacryloyloxy group or their mixture.

A compounding amount of said prepolymer is preferably 5–50 wt %. When the amount is less than 5 wt %, it is impossible to obtain a sufficient setting compound by ultraviolet rays and durability in continuous printing becomes weak, while, when the amount exceeds 50 wt %, strength before setting by ultraviolet rays is weak, workability and solid maintenance at the time of sheet molding are worse, and surface hardness of the setting compound is high to lose flexibility.

For the Styrene-butadiene rubber (component (B)) used in the present invention, it is possible to use a random copolymer of styrene having 20–30 wt % of styrene content and butadiene. This random copolymer is common rubber manufactured by an emulsion polymerization method or solution polymerization method, and can be used alone or in a mixture of more than two in a compounding amount of 35–65 wt %. When the amount is less than 35 wt %, the setting compound lacks rubber elasticity and wear resistance at the time of printing simultaneously becomes worse, and when the amount exceeds 65 wt %, workability (productivity) at the time of sheet molding is worse, and sheet solid maintenance before setting is unfavorably worsened. The random copolymer having 20–30 styrene content is excellent in rubber elasticity, developer solubility, wear resistance, sheet moldability and the like. When the styrene content is less than 20 wt %, image forming ability and sheet moldability are inferior, and when the styrene content exceeds 30 wt %, surface hardness of the obtained composition is increased, and there is not obtained any satisfiable printing image for a printed material having low surface smoothness such as corrugated cardboard.

Moreover, the block copolymer (component (C)) used in the present invention is a thermoplastic elastomer copolymer consisting of a polystyrene block as more than two thermoplastic non-elastomeric components and a polybutadiene or polyisoprene block as an elastomer component interposed between and bonded to the thermoplastic non-elastomeric components, which styrene content is preferably 11–37 wt %. Said copolymer having 11–37 wt % of styrene content is excellent in rubber elasticity, developer solubility, image forming ability, wear resistance, sheet moldability and the like. When the styrene content is outside the above range, for the same reason as that of said Styrene-butadiene rubber, it is impossible to obtain satisfiable properties as a flexographic polymer component. Moreover, its compounding amount is preferably 25–55 wt %. When the amount is less than 25 wt %, it is impossible to obtain a sharp image in printing and developing, and when the amount exceeds 55 wt %, it is impossible to obtain a composition simultaneously satisfying rubber elasticity, printing durability and development.

Moreover, the liquid prepolymer (component (D)) used in the present invention is polybutadiene, a butadiene-styrene copolymer or their derivatives, having 1000–5500 mean molecular weight and can be used alone or as a mixture of more than two in a compounding amount of 0–15 wt %. When said compounding amount exceeds 15 wt %, solid maintenance of a compound sheet before setting becomes worse. This liquid prepolymer is effective in case of improving transparency of a flexographic printing plate composition, in case of obtaining a deep relief image, and in case of improving sheet moldability by imparting proper viscosity at a high temperature of the composition.

The photopolymerizable monomer used in the present invention has one or more than two of an acryloyl group ($CH_2$=CHCO—), methacryloyl group ($CH_2$=C($CH_3$)CO—) and vinyl group ($CH_2$=CH—) per one molecule, and can be free radical polymerized, and can be used alone or as a mixture of more than two in a compounding amount of 3–50 wt % which is a usual amount used by those skilled in the art. When the amount is less than 3 wt %, ultraviolet ray setting density is lowered and physical properties of a compound are extremely lowered, and when the amount exceeds 50 wt %, surface hardness of the ultraviolet ray setting material becomes high and printability is unfavorably worsened.

As the photopolymerizable monomer, mention may be made of allylacrylate, allylmethacrylate, benzylacrylate, benzylmethacrylate, butoxyethyl acrylate, butoxyethyl methacrylate, butanediol monoacrylate, butoxyethylene glycolacrylate, epichlorohydrin modified butylacrylate, t-butylaminoethyl methacrylate, caprolactone acrylate, 3-chloro-2-hydroxypropyl-methacrylate, 2-cyanoethyl acrylate, cyclohexyl acrylate, cyclohexyl-methacrylate, dicyclopentanyl acrylate, dicyclopentanyl-methacrylate, 2,3-dibromopropyl acrylate, 2,3-dibromo-propyl methacrylate, dicyclopentenyl-acrylate, dicyclopentenyloxyethylacrylate, dicyclopentenyl oxyethyl methacrylate, N,N-diethylamino ethylacrylate, N,N-diethylaminoethylmethacrylate, 2-ethoxyethylacrylate, 2-ethoxyethyl methacrylate, ethylcarbitol acrylate, 2-ethylhexyl acrylate, 2-ethylhexyl methacrylate, glycerol methacrylate, glycidyl acrylate, glycidyl methacrylate, heptadecafluorodecyl acrylate, heptadecafluorodecyl methacrylate, 2-hydroxyethylacrylate, 2-hydroxyethyl methacrylate, caprolactone modified 2-hydroxy ethylacrylate, caprolactone modified 2-hydroxyethyl methacrylate, 2-hydroxy-3-(meth)acryloxypropyltrimethylammonium chloride, 2-hydroxy-3-(meth)acryloxypropyl dimethylamine, 2-hydroxypropyl-acrylate, 2-hydroxypropyl methacrylate, isobonylacrylate, isobonyl methacrylate, isodecyl acrylate, iso-octyl acrylate, laurylacrylate, γ-methacryloxypropyltrimethoxysilane, 2-methoxy ethylacrylate, methoxydiethyleneglycol methacrylate, methoxytriethyleneglycolacrylate, methoxy triethyleneglycol methacrylate, methoxy tetraethyleneglycol methacrylate, methoxydipropyleneglycol acrylate, methoxylated cyclodecatrieneacrylate, morpholineacrylate, nonylphenoxypolyethyleneglycolacrylate, nonylphenoxypolypropylene glycolacrylate, octafluoro pentylacrylate, octafluoropentyl methacrylate, octylacrylate, phenoxyhydroxy propylacrylate, phenoxyethylacrylate, phenoxyethyl methacrylate, phenoxydiethylene glycolacrylate, phenoxytetraethyleneglycolacrylate, phenoxyhexaethylene glycolacrylate, ethyleneoxide modified phenoxylated acrylate phosphate, ethyleneoxide modified phenoxylated phosphoric methacrylate, phenylmethacrylate, ethyleneoxide modified phosphoric acrylate, ethyleneoxide modified phosphoric methacrylate, ethyleneoxide modified butoxylated phosphoric acrylate, ethyleneoxide modified phthalic acrylate, ethyleneoxide modified phthalic methacrylate, stearylacrylate, stearylmethacrylate, ethyleneoxide modified succinic acrylate, sulfonic acid sodaethoxyacrylate, sulfonic acid sodaethoxymethacrylate, tetrafluoropropyl acrylate, tetrafluoropropyl methacrylate, tetrahydrofurfuryl acrylate, tetrahydrofurfurylmethacylate, caprolactone modified tetrahydrofurfurylacrylate, trichloroethyl acrylate, trifluoroethylmethacrylate, vinylacetate, N-vinylcaprolactam, N-vinylpyrrolidone, allylated cyclohexyl diacrylate, acrylated isocyanurate, bis(acryloxyneopentylglycol)-adipate, ethyleneoxide modified bisphenol A diacrylate, ethyleneoxide modified bisphenol S diacrylate, bisphenol A dimethacrylate, ethyleneoxide modified bisphenol A dimethacrylate, ethyleneoxide modified bisphenol F diacrylate, 1,4-butanedioldiacrylate, 1,3-butyleneglycoldiacrylate, 1,3-butyleneglycoldimethacrylate, dicyclopentanyl diacrylate, diethyleneglycol diacrylate, diethyleneglycol dimethacrylate, epichlorohydrin modified diethyleneglycol dimethacrylate, dipentaerythritol hexacrylate, dipentaerythritol monohydroxy pentacrylate, alkyl modified dipentaerylthritol pentacrylate, alkyl modified dipentaerythritol tetraacrylate, alkyl modified dipentaerythritol triacrylate, caprolactone modified dipentaerythritol hexacrylate, ditrimethylolpropanetetracrylate, epichlorohydrin modified ethyleneglycoldiacrylate, ethyleneglycol dimethacrylate, glycerolacrylate, glycerol dimethacrylate, epichlorohydrin modified glycerol triacrylate, 1,6-hexanediol diacrylate, 1,6 hexanediol methacrylate methoxilated cyclohexyldiacrylate, neopentylglycol diacrylate, neopentylglycol dimethacrylate, pentaerythritol triacrylate, pentaerythritol tetramethacrylate, stealinic acid modified pentaerythritol diacrylate, ethyleneoxide modified phosphoric acid diacrylate, ethyleneoxide modified phosphoric acid triacrylate, ethyleneoxide modified phosphoric acid dimethacrylate, polyethyleneglycol 600 diacrylate, polyethyleneglycol 200 dimethacrylate, polypropyleneglycol 400 diacrylate, polypropyleneglycol 400 dimethacrylate, tetraethyleneglycoldiacrylate, tetraethyleneglycol dimethacrylate, triethyleneglycol diacrylate, triethyleneglycoldimethacrylate, triethyleneglycolvinylether, triglycerol diacrylate, neopentylglycol modified trimethylolpropane diacrylate, trimethylolpropanetriacrylate, ethyleneoxide modified trimethylolpropanetriacrylate, propyleneoxide modified trimethylolpropanetriacrylate, trimethylolpropane trimethacrylate, epichlorohydrine modified trimethylolpropane triacrylate, tripropyleneglycol diacrylate, tris(acryloxyethyl)isocyanurate, caprolactone modified tris(acryloxyethyl)isocyanurate, zinc diacrylate, zinc dimethacrylate and the like.

As the photopolymerization initiator used in the present invention, use may be made of one or more than one of chloroacetophenone, diethoxyacetophenone, hydroxyacetophenone, α-aminoacetophenone, benzoinalkylethers, benzyldimethylketal, benzophenones, methyl)-benzoylbenzoate, thioxansone, acylphosphineoxide, glyoxyester, 3-ketocoumarin, 2-ethylanthraquinone, camphorquinone, benzyl, Michler's ketone, tetramethylthiuram monosulfide, 3,3',4,4'-tetra(t-butylperoxicarbonyl)-benzophenone and the like, compounding 0.5-30 wt %, preferably 2-8 wt % of the whole flexographic composition. When the amount is less than 0.5 wt %, ultraviolet setting density is lowered and physical properties of a compound are extremely lowered, and when the amount exceeds 30 wt %, no extending effect is observed in each property, compound unit cost becomes high that is uneconomical.

Moreover, for the purpose of increasing canstability of the obtained composition and securing the use period for a long time, use can be made of one or more than one of additives such as hydroquinone, methoquinone, phenothiazine, mono-t-butylhydroquinone, catechol, p-t-butylcatechol, benzoquinone, 2,5-di-t-butylhydroquinone, anthraquinone, 2,6-di-t-butylhydroxytoluene and the like, at 50–3000 ppm of the whole flexographic composition.

The above compounding components are easily mixed by using an open roll, pressure kneader or solution mixing with an organic solvent, and then formed into a photosensitive resin layer by an extruder, press and the like. It is also possible to add commonly used rubber plastic additives, such as softener, plasticizer, wax, natural resin, synthetic resin, if necessary, without spoiling physical properties. The thus obtained photosensitive resin layer is exposed and crosslinked by ultrahigh pressure mercury lamp, high pressure mercury lamp, metallic halide lamp, xenon lamp, chemical lamp and the like, and then cleaned non-exposed portions by using alcohols, hydrocarbons alone or as a mixture, thereby obtaining a relief plate for flexographic printing plate. The photosensitive flexographic printing plate composition of the present invention has its surface hardness of less than 70 at Shore A type after setting.

The present invention is explained by the following synthetic examples, examples and comparative examples.

SYNTHETIC EXAMPLE 1

MANUFACTURE OF PHOTOPOLYMERIZABLE PREPOLYMER 48.4 g of 2,4-tolylene diisocyanate (hereinafter referred to as "TDI") was solved in 145.2 g of dioxane, the resulting solution was charged in a reactor of 500 ml, a solution solving 16.6 g of 1,4-butanediol, 0.2 g of hydroquinone and 0.2 g of triethylenediamine in 49.8 g of dioxane was dropped with stirring under a nitrogen atmosphere, while, a reaction solution temperature was maintained at 75°–85° C., and after completion of dropping, the solution was reacted at the same temperature for 2 hours and a reaction product A was obtained.

Then, a solution solving 10.8 g of 2-hydroxyethylmethacrylate (hereinafter referred to as "HEMA") in 32.4 g of dioxane was added to said reactor, stirred in a nitrogen atmosphere and reacted at 75°–80° C. for 2 hours. Moreover, a solution solving 100 g of liquid rubber "JIS-HTPB (made by Nippon Gosei Gum K.K., mean molecular weight 2120, hydroxyl group content 0.93)" in 300 g of dioxane was charged in another reactor of 1000 ml, the prereaction product A was added by stirring and dropping under a nitrogen atmosphere. During dropping, the reaction solution was maintained at 75°–80° C., and after completion of dropping, the solution was reacted at the same temperature for 6 hours, and the reaction was completed by confirming disappearance of absorption (2250 cm$^{-1}$) of an isocyanate group by the infrared absorption spectrum. The reaction solution was pale yellow transparent, and its viscosity was 450 cps (30° C. BH type viscometer).

To a beaker filled with 5400 ml of n-hexane was gradually dropped said reaction solution, and a white precipitate was obtained. After removing a solvent layer by a decantation, the precipitate was dried in a vacuum dryer for 2 days. After drying, solid-like urethane acrylate was obtained. A yield of the polymer was 162 g (yield 92%). Measurement of the infrared absorption spectrum observed specific absorption of 3300 cm$^{-1}$, 2920 cm$^{-1}$, 1710 cm$^{-1}$ and 1640 cm$^{-1}$ Moreover, in molecular weight measurement by gel permeation chromatography (GPC), a mean molecular weight ($\overline{Mn}$) was 3800.

Then, sensitivity of the polymer was measured by a gray scale method. That is a 10% tetrahydrofuran solution of the polymer was coated on a copperplate, dried at a room temperature for 2 hours, thereafter placed a Kodak step tablet No. 2 thereon, exposed to an ultrahigh pressure mercury lamp (3 kW ×1 lamp) from a distance of 500 mm for 10 seconds, developed by isophorone for 2 minutes, and an insolubilization step was applied. The result was at the 9th grade. Moreover, this urethane acrylate was solved in tetrahydrofuran, 5% of Irgacure 651 was added thereto as a sensitizer and a photosensitive solution was manufactured. Said photosensitive solution was coated on a glass plate so as to evaporate and dry tetrahydrofuran. A thickness after drying was 100 μm. A curing film was obtained by exposing to an ultrahigh pressure mercury lamp 3 kW (made by Oak Seisakusho) from a distance of 500 mm for 2 minutes.

Tensile strength and extensibility of the curing film were measured by a tensile tester (tensile rate 100 mm/min), and the results are shown in Table 1. Tensile strength was 165 kg/cm$^2$ and extensibility was 350%.

SYNTHETIC EXAMPLES 2–6

MANUFACTURE OF PHOTOPOLYMERIZABLE PREPOLYMER

Except that liquid rubber and the kind of dihydric alcohol of less than 2000 molecular weight used in Synthetic Example 1 are changed, urethaneacrylate was manufactured by operating in the same manner as in Synthetic Example 1. Compounding ratios and physical properties of the obtained urethaneacrylate are shown in Table 1. A compounding example increasing the repetitive unit number n of a hard segment is also shown in Table 1. The weight of liquid rubber used herein is 100 g.

TABLE 1

| Synthetic Example | Dienic liquid rubber having hydroxyl group | Dihydric alcohol of less than 2000 molecular weight | | HEMA (g) | TDI (g) | Hydroquinone (g) | Triethylene diamine (g) | Mean molecular weight | *2 Property absorption by infrared absorption spectrum | Tensile property | |
|---|---|---|---|---|---|---|---|---|---|---|---|
| | | Kind | Weight (g) | | | | | | | Tensile strength (kg/cm$^2$) | Extensibility (%) |
| 1 | JSR HTPB | 1,4-butanediol | 16.6 | 10.8 | 48.4 | 0.2 | 0.2 | 3400 | ○ | 165 | 350 |
| 2 | " | glycerol α-monoallyl-ether | 21.8 | 10.8 | 48.4 | 0.2 | 0.2 | 3600 | ○ | 190 | 290 |
| 3 | " | 1,2-propyleneglycol | 14.0 | 10.8 | 48.4 | 0.2 | 0.2 | 3300 | ○ | 180 | 300 |
| 4 | *1 R-45D | 1,4-butanediol | 59.9 | 10.8 | 130.4 | 0.3 | 0.3 | 6900 | ○ | 217 | 270 |
| 5 | " | 1,4-butanediol | 89.6 | 10.8 | 188.0 | 0.4 | 0.4 | 9500 | ○ | 267 | 430 |
| 6 | " | triethyleneglycol | 120.9 | 10.8 | 245.6 | 0.5 | 0.5 | 11200 | ○ | 290 | 480 |

*1 Poly bd R-45D made by Idemitsu. Mean molecular weight 2800 Hydroxyl group content 0.85 (meq/g)
*2 ○ means that property absorption was observed in 3300 cm$^{-1}$, 2920 cm$^{-1}$, 1710 cm$^{-1}$, 1640 cm$^{-1}$.

EXAMPLE 1

To 135 parts by weight of a mixed solvent consisting of 100 parts by weight of methylethylketone, and 35 parts by weight of toluene were added 25 parts by weight of a compound obtained by the above Synthetic Example 1, 45 parts by weight of Styrene-butadiene rubber having the styrene content of 23.5%, 30 parts by weight of a Styrene-isoprene block copolymer having the styrene content of 15%, 6 parts by weight of trimethylolpropanetrimethacrylate, 7 parts by weight of polyethyleneglycoldiacrylate, 0.01 part by weight of hydroquinone and 1.6 parts by weight of Irgacure 651 (Ciba Geigy), and solved homogeneously as stirring.

Then, said mixed solution was flowed onto a plate, left in a dryer at about 50° C. for about 20 hours, the solvent was removed therefrom, and a photosensitive sheet of 4 mm in thickness was obtained. One surface of the thus obtained sheet was irradiated with ultraviolet rays at accumulated luminous energy 110 mJ/cm$^2$ with the use of an ultrahigh pressure mercury lamp (Oak Seisakusho HMW-401), and back-exposed. Then, the other surface was irradiated with ultraviolet rays through a negative film at accumulated luminous energy 1600 mJ/cm$^2$. A non-exposed portion was cleaned with the use of a developer consisting of 4 parts by weight of 1,1,1-trichloroethane and 1 part by weight of n-butanol, dried in a dryer at 65° C. for 10 minutes, and obtained a relief pattern having Shore A hardness of 62 degree. Said composition was excellent in printing properties, image forming ability, rubber elasticity and the like, and insolubilization by a Kodak step tablet was the 11th grade.

EXAMPLE 2

15 parts by weight of the compound obtained in Synthetic Example 2, 50 parts by weight of Styrene-butadiene rubber having 25% styrene content, 35 parts by weight of a Styrene-butadiene block copolymer having 28% styrene content, 5 parts by weight of trimethylolpropanetriacrylate, 4 parts by weight of phenoxyethylacrylate, 7 parts by weight of triethyleneglycoldiacrylate, 0.01 part by weight of methoquinone, 1.5 parts by weight of Irgacure 651 (Ciba-Geigy) and 0.5 part by weight of Irgacure 185 (Ciba-Geigy) were admixed in an open roll at 95° C., maintained under pressure of 50 Kgf/cm$^2$ by using a press of 100° C. for 3 minutes, and a photosensitive sheet of 3.0 mm in thickness was obtained. One surface of the thus-obtained sheet was irradiated with ultraviolet rays at accumulated luminous energy 90 mJ/cm$^2$ with the use of an ultrahigh pressure mercury lamp (Oak Seisakusho HMW-401) and back-exposed. Then, the other surface was irradiated with ultraviolet rays at accumulated luminous energy 1000 mJ/cm$^2$ through a negative film. A non-exposed portion was cleaned with the use of a developer consisting of 3 parts by weight of 1,1,1-trichloroethane and 1 part by weight of n-butanol, dried in a dryer at 65° C. for 10 minutes, and obtained a relief pattern having a Shore A hardness of 66 degree. Said composition was excellent in printing properties, image moldability, rubber elasticity and the like, and insolubilization by a Kodak step tablet was the 12th grade.

EXAMPLE 3

40 parts by weight of the compound obtained in Synthetic Example 1, 25 parts by weight of Styrene-butadiene rubber having 23.5% styrene content, 28 parts by weight of a Styrene-isoprene block copolymer having 15% styrene content, 7 parts by weight of liquid 1,2-polybutadiene having 3000 molecular weight, 5 parts by weight of tetramethylolmethane tetracrylate, 3 parts by weight of 1,6-hexanedioldiacrylate, 4 parts by weight of trimethylolpropanetriacrylate, 0.015 part by weight of hydroquinone, and 3 parts by weight of benzophenone were admixed in a pressure kneader of 100° C. for 5 minutes, maintained under pressure of 40 Kgf/cm$^2$ with the use of a press of 100° C. for 3 minutes, and a photosensitive sheet of 2.0 mm in thickness was obtained. One surface of the thus obtained sheet was irradiated with ultraviolet rays at accumulated luminous energy 90 mJ/cm$^2$ with the use of an ultrahigh pressure mercury lamp (Oak Seisakusho HMW-401), and back-exposed. Then, the other surface was irradiated with ultraviolet rays at accumulated luminous energy 1000 mJ/cm$^2$ through the original picture. A non-exposed portion was cleaned with 1,1,1-trichloroethane as a developer, and a relief pattern having a Shore A hardness of 60 degree was obtained. Said composition was excellent in printing properties, image moldability, rubber elasticity and the like, and insolubilization by a Kodak step tablet was the 11th grade.

EXAMPLE 4

10 parts by weight of the compound obtained in Synthetic Example 3, 49 parts by weight of Styrene-butadiene rubber having 23.5% styrene content, 41 parts by weight of a Styrene-butadiene block copolymer having 28% styrene content, 6 parts by weight of trimethlolpropane triacrylate, 2 parts by weight of Stearylacrylate, 4 parts by weight of neopentylglycoldiacrylate, 3 parts by weight of polyethyleneglycoldiacrylate, 0.01 part by weight of phenothiazine and 1.0 part by weight of benzophenone were admixed in a pressure kneader of 100° C. for 5 minutes, maintained under pressure of 40 Kgf/cm$^2$ with the use of a press of 100° C. for 3 minutes, and a photosensitive sheet of 2.5 mm in thickness was obtained. One surface of the thus obtained sheet was exposed by a chemical lamp of 20 W for 3 minutes, and back-exposed. Then, the other surface was exposed through the original picture for 15 minutes. A non-exposed portion was cleaned with 1,1,1-trichloroethane as a developer, and a relief pattern having a Shore A hardness of 59 degree was obtained. Said composition was excellent in printing properties, image moldability, rubber elasticity and the like, and insolubilization by a Kodak step tablet was the 12th grade.

COMPARATIVE EXAMPLE 1

4 parts by weight of the compound obtained in Synthetic Example 1, 35 parts by weight of Styrene-butadiene rubber having 23.5% styrene content, 61 parts by weight of a Styrene-butadiene block copolymer having 28% of styrene content, 6 parts by weight of trimethylolpropane triacrylate, 3 parts by weight of tetramethylolmethane tetracrylate, 3 parts by weight of neopentylglycol diacrylate, 0.01 part by weight of hydroquinone and 2 parts by weight of benzophenone were admixed in a pressure kneader of 100° C., maintained under pressure of 45 Kgf/cm$^2$ with the use of a press of 95° C. for 3 minutes, and a photosensitive sheet of 2.5 mm in thickness was obtained. One surface of the thus obtained sheet was irradiated with ultraviolet rays at accumulated luminous energy of 90 mJ/cm$^2$ with the use of an ultrahigh mercury lamp (Oak Seisakusho, HMW-401), and back-exposed. Then, the other surface was irradiated with ultraviolet rays at accumulated luminous energy of 1000 mJ/cm$^2$ through the original picture. A non-exposed portion was cleaned with a cleaning fluid consisting of 3 parts by weight of 1,1,1-trichloroethane and 1 part by weight of n-butanol, and a relief pattern having a Shore A hardness of 65 degree was obtained. Said composition was good in printing properties and rubber elasticity, but poor in image moldability, and insolubilization by a Kodak step tablet was the 7th grade.

COMPARATIVE EXAMPLE 2

55 parts by weight of the compound obtained in Synthetic Example 3, 10 parts by weight of Styrene-butadiene rubber having 23.5% styrene content, 35 parts by weight of a Styrene-butadiene block copolymer having 28% styrene content, 6 parts by weight of trimethylolpropane trimethacrylate, 7 parts by weight of polyethyleneglycol diacrylate, 0.01 part by weight of methoquinone and 1.5 parts by weight of benzophenone were mixed in an open roll set at 90° C. of a surface temperature, maintained under pressure of 45 Kgf/cm² with the use of a press of 95° C. for 3 minutes, and a photosensitive sheet of 2.5 mm in thickness was obtained. One surface of the thus obtained sheet was irradiated with ultraviolet rays at accumulated luminous energy of 90 mJ/cm² with the use of an ultrapressure mercury lamp (Oak Seisakusho, HMW-401), and back-exposed. Then, the other surface was irradiated with ultraviolet rays at accumulated luminous energy of 1000 mJ/cm² through the original picture. A non-exposed portion was cleaned with a cleaning fluid consisting of 3 parts by weight of 1,1,1-trichloroethane and 1 part by weight of n-butanol, and a relief pattern having a Shore A hardness of 72 degree was obtained. Said composition was good in rubber elasticity and image moldability but poor in printing properties for the non-smooth surface, and insolubilization by a Kodak step table was the 11th grade.

TEST EXAMPLE

Each kind of tests was conducted with respect to Examples 1-4 and Comparative Examples 1 and 2, and the results are shown in Table 2.

First, a testing method is explained.

The obtained photosensitive composition was sandwiched in a polyester film of 180 μm thick and a sheet of 5 mm thick was obtained by heat press.

One surface of said sheet was irradiated with ultraviolet rays of 100 mJ/cm² by a high pressure mercury lamp, and then a negative film having an image was adhered to the other surface, and ultraviolet rays of 500 mJ/cm² were irradiated through such a film. Then, a non-exposed portion is cleaned by a brush with the use of 1,1,1-trichloroethane, dried at 50° C. for 1 hours, thereafter cooled at a room temperature, irradiated by 1000 mJ/cm² with the use of a high pressure mercury lamp, and back-exposed. Highlight forming ability (%) and reverse line depth in such plate were measured.

TABLE 2

| | Hardness (Shore A) | Highlight forming ability (%) | | 500 μm width reverse line depth (μm) | 1,000,000 printing test with oil ink |
|---|---|---|---|---|---|
| | | 120 line/ inch 3% | 150 line/ inch 3% | | |
| Example 1 | 62 | 100 | 100 | 190 | good |
| Example 2 | 66 | 100 | 100 | 180 | good |
| Example 3 | 60 | 100 | 100 | 185 | good |
| Example 4 | 59 | 100 | 100 | 200 | good |
| Comparative Example 1 | 65 | 80 | 90 | 80 | good |
| Comparative Example 2 | 72 | 100 | 100 | 180 | wear thickness in a letter |

It is understood from Table 2 that a flexographic plate manufactured by using the composition obtained from Examples 1-4 has high performance as a flexographic plate.

As explained above, the composition of the present invention contains a special photosensitive oligomer and polymer component having a rubbery skeleton, and improves various necessary physical properties as a flexographic plate material by a large margin in addition to rubber elasticity, printing characteristic and image moldability. Moreover, ultraviolet permeability of the whole composition is further improved, and a deep and sharp relief pattern can be formed. Furthermore, with the use of the composition according to the present invention, printing with high precision can easily be carried out without requiring any special technique, regardless of smooth surface and non-smooth surface, as use of corrugated board, newspaper, magazine and the like, and the present invention has a very high industrially utilizable value.

What is claimed is:

1. A photosensitive flexographic printing plate composition comprising
   (A) 5-50 wt % of a photopolymerizable prepolymer consisting essentially of a component having the general formula

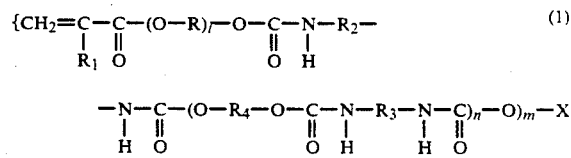

where R is an alkylene group or polyoxyalkylene group having 2-8 carbons, $R_1$ is an H or $CH_3$ group, $R_2$ and $R_3$ are residues of diisocyanate compounds excluding the isocyanate groups, $R_4$ is a residue excluding the hydroxyl group(s) of a dihydric alcohol of molecular weight of less than 2000 and the general formula

where $R_5$ is an alkylene group having 2-8 carbons, $R_6$ and $R_7$ are an H, $CH_3$, acryloyloxy, methacryloyloxy, or allyloxy group, X is a residue excluding hydroxyl group(s) of a dienic liquid rubber containing hydroxyl group(s), l is an integer of 1-4, m is 1<m<4, and n is an integer of 1-16,
   (B) 35-65 wt % of a random copolymer of styrene-butadiene rubber containing 20-30 wt % of styrene,
   (C) 25-55 wt % of a block copolymer selected from the group consisting of a styrene-butadiene block copolymer and styrene-isoprene block copolymer containing 11-37 wt % of styrene,
   (D) 0-15 wt % of a dienic liquid rubber selected from the group consisting of polybutadiene having 1000-5500 molecular weight, a butadiene-styrene copolymer and an acrylonitrile-butadiene copolymer having a hydroxyl group in the molecule,
   (E) 3-50 wt % of a photopolymerizable monomer having at least one photopolymerizable ethylenically unsaturated group, and
   (F) 0.5-30 wt % of a photopolymerization initiator.

2. The photosensitive flexographic printing plate of claim 1, wherein said photopolymerizable prepolymer contains a hard segment from the dihydric alcohol of formula (2) and a soft segment consisting of an X residue of formula (1).

3. The photosensitive flexographic printing plate of claim 1, wherein n is an integer of 2-16.

4. The photosensitive flexographic printing plate of claim 1, wherein said photopolymerizable monomer includes trimethylolpropane tri(meth)acrylate.

* * * * *